United States Patent [19]

Saito

[11] Patent Number: 5,729,439
[45] Date of Patent: Mar. 17, 1998

[54] PRINTED WIRING SUBSTRATE

[75] Inventor: Ichiro Saito, Fukushima-ken, Japan

[73] Assignee: Alps Electric Co., Ltd., Tokyo, Japan

[21] Appl. No.: 712,535

[22] Filed: Sep. 11, 1996

[30] Foreign Application Priority Data

Sep. 18, 1995 [JP] Japan .................. 7-263450

[51] Int. Cl.$^6$ ...................................... H05K 1/16
[52] U.S. Cl. .................. 361/760; 361/763; 361/765;
361/808; 333/247; 333/185; 174/250; 174/260;
257/676; 257/724; 257/786
[58] Field of Search ........................ 361/760, 763,
361/764, 765, 782, 783, 766, 820, 821,
748, 811, 808; 333/247, 185, 202, 204;
174/250, 260, 263; 257/676, 724, 786

[56] References Cited

U.S. PATENT DOCUMENTS

| | | | |
|---|---|---|---|
| 4,882,656 | 11/1989 | Menzies, Jr. et al. | 361/784 |
| 5,023,753 | 6/1991 | Abe | 361/782 |
| 5,132,864 | 7/1992 | Takemura et al. | 361/777 |
| 5,400,221 | 3/1995 | Kawaguchi | 361/771 |
| 5,453,581 | 9/1995 | Liebman et al. | 174/261 |

FOREIGN PATENT DOCUMENTS

| | | |
|---|---|---|
| 62-112179 | 7/1987 | Japan . |
| 62-140772 | 9/1987 | Japan . |

*Primary Examiner*—Leo P. Picard
*Assistant Examiner*—David Foster
*Attorney, Agent, or Firm*—Guy W. Shoup

[57] ABSTRACT

A printed wiring substrate in which first and second parts are mounted in adjacent with each other on soldering lands formed on an insulative board and put to reflow soldering, wherein the width of the land on which at least one of the parts is soldered is made greater on the side where the parts oppose to each other and made gradually narrowed toward the opposite side. By varying the width of the soldering land in reflow soldering using a cream solder, the surface tension of the solder is exerted such that the two parts are drawn to each other and brought into intimate contact thereby enabling close contact soldering.

6 Claims, 3 Drawing Sheets

PRINTED WIRING SUBSTRATE

BACKGROUND OF THE INVENTION

1. Field of the Invention

The present invention concerns a printed wiring substrate in which two face-mounting parts are attached by so-called intimate mounting to the surface of a printed substrate being disposed in adjacent with each other by a reflow soldering method.

2. Description of the Related Art

In a usual printed wiring substrate in which face-mounting parts mounted on the surface of a printed substrate are connected with each other by means of a soldering land, when two parts are connected with each other on one soldering land, it is sometimes necessary to connect them as close as possible or in contact with each other in view of a demand for the performance. In such a case, while it is desirable that the two parts are brought closer or into intimate contact with each other when the two parts are mounted on the surface of the printed substrate, a gap or a dead space is inevitably formed between adjacent parts due to structural limit of a part mounting device (mounter). Then, after mounting parts on the surface of the printed substrate and soldering them by a reflow method, positions for the soldered parts are displaced manually using a soldering iron or the like thereby bringing the parts into intimate contact with each other.

FIG. 9 shows the shape of soldering lands on a printed substrate of the prior art on which parts are to be mounted, while FIG. 8 shows an example of operation for bringing parts into intimate contact with each other by manual operation using a soldering iron after applying reflow soldering.

In FIG. 8 and FIG. 9 are shown a printed substrate 1, soldering lands 2 to 5, a transistor 6 as one of parts intended to be brought into intimate contact, a chip capacitor 7 as the other of parts to be brought into intimate contact, soldering irons 8 and 9, and a dead space S between the parts caused by using mounters. In FIG. 8, solder for connecting leads of the transistor 6 and electrodes of the chip capacitor 7 with the soldering lands 2 to 5 is not illustrated.

The soldering lands 2 and 3 are common lands to which both of the two parts 6 and 7 are soldered. In the example shown in FIG. 8, the leads of the transistor and the electrodes of the chip capacitor are soldered. The exclusive lands 4 and 5 are used for soldering the leads of the transistor. Each of the soldering lands 2 to 5 has a rectangular shape with a constant lateral width W.

However, in the configuration of the soldering land of the prior art, since the parts 6 and 7 are reflow-soldered to mounted positions on the soldering lands 2 to 5, the dead space S formed upon mounting the parts is left as it is. Then, it is necessary in the subsequent step as shown in FIG. 8 to displace, for example, the chip capacitor 7 as one of the parts toward the transistor 6 as the other of the parts and bringing them into intimate contact by manual operation using the soldering irons 8 and 9.

Further, when the parts are displaced and brought into intimate contact by manual operation, thermal and mechanical stresses exert on the parts to possibly destroy them or result in failed products caused by operation such as soldering bridge.

In addition, there are other restrictions that parts can not be brought into intimate contact with each other even if it is desired so in order to ensure a space for the access of the soldering iron and that heat sensitive parts can not be placed.

SUMMARY OF THE INVENTION

In view of the above, it is an object of the present invention to provide a printed wiring substrate capable of mounting two parts in an intimate contact state, with no manual soldering for correction which would cause the foregoing disadvantages.

The foregoing object can be attained in accordance with a printed wiring substrate of the present invention, comprising a printed substrate on which soldering lands are formed and a plurality of face-mounted parts soldered by a reflow method to the soldering lands, in which each of the soldering lands has a lateral width made larger at an intermediate portion than at both ends, and one of the electrodes of a first face-mounted part is soldered to one end of the soldering land, while one of the electrodes of a second face-mounted part is soldered to the other end of the soldering land.

The soldering land described above has the following functions. Since the surface tension of molten solder in a reflow soldering step is stronger in a larger width area of the soldering land, the face-mounted part is attracted to the intermediate portion with the larger width of the soldering land. Further, the surface tension of the molten solder between the electrodes of the two face-mounted parts disposed in adjacent with each other exerts a force of attracting the parts with each other, so that the two parts floating on the molten solder are drawn and brought into intimate contact with each other and put to reflow soldering.

DESCRIPTION OF THE PREFERRED EMBODIMENTS

Figure 1:
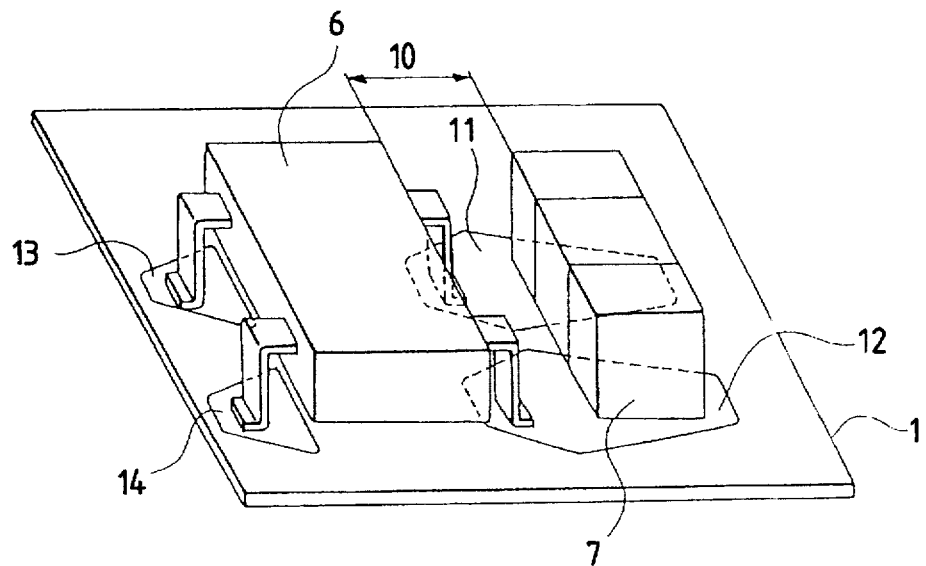
FIG. 1 is a view illustrating the state of mounting parts on a printed substrate according to a first embodiment of the present invention.
Figure 2:
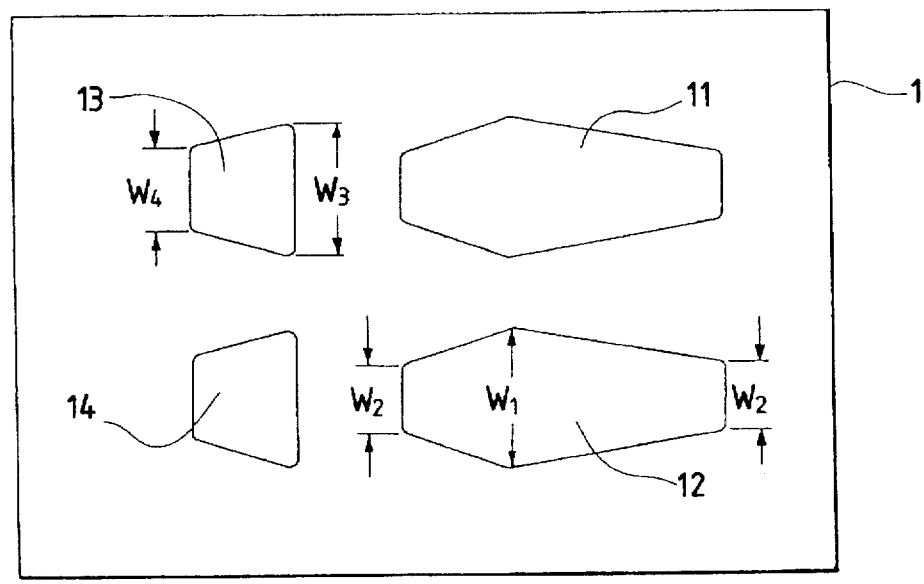
FIG. 2 is a pattern view of the printed substrate according to the first embodiment of the present invention.
Figure 3:
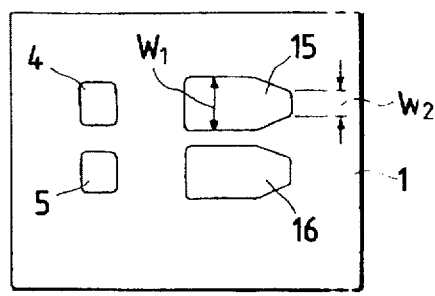
FIG. 3 is a pattern view of a printed substrate according to a second embodiment of the present invention.
Figure 4:
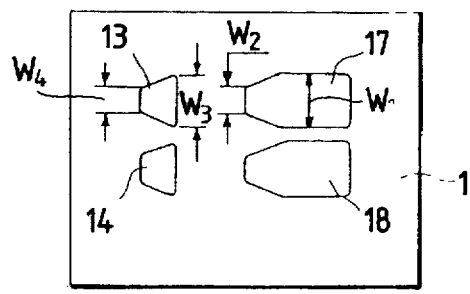
FIG. 4 is a pattern view of a printed substrate according to a third embodiment of the present invention.
Figure 5:
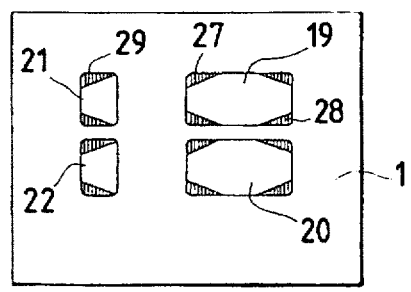
FIG. 5 is a pattern view of a printed substrate according to a fourth embodiment of the present invention.
Figure 6:
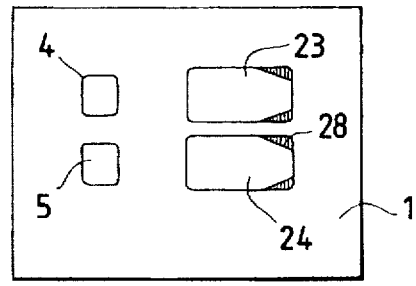
FIG. 6 is a pattern view of a printed substrate according to a fifth embodiment of the present invention.
Figure 7:
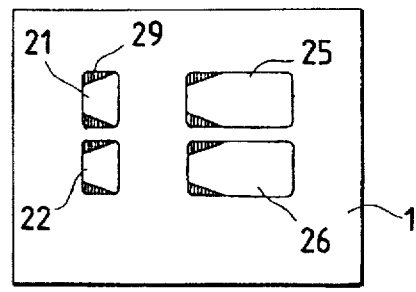
FIG. 7 is a pattern view of a printed substrate according to a sixth embodiment of the present invention.
Figure 8:
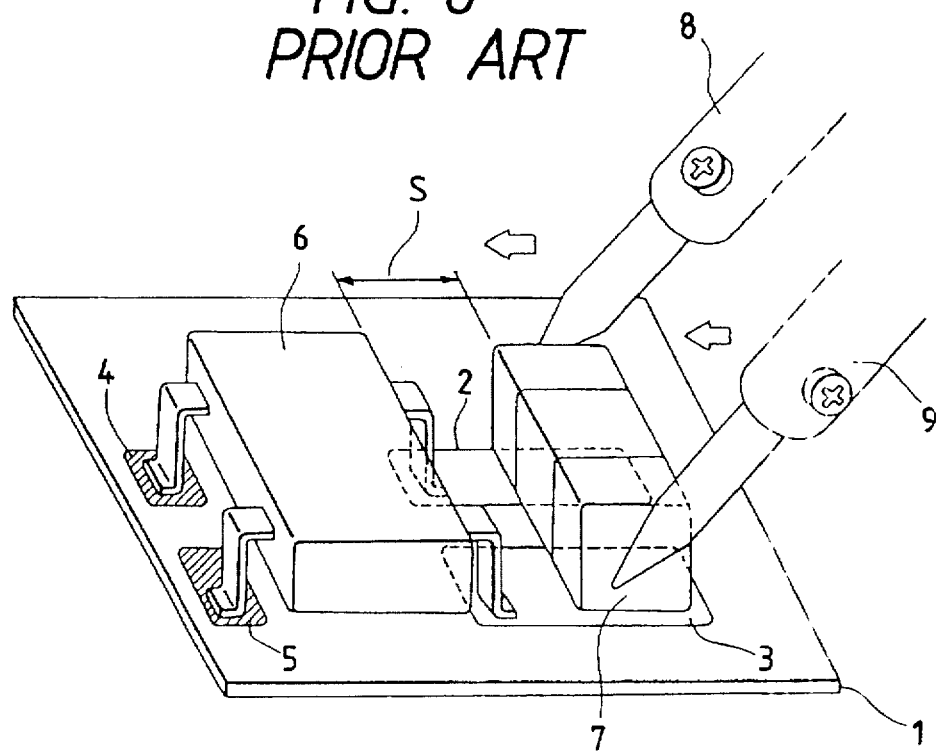
FIG. 8 is a view illustrating the operation of mounting parts on a printed substrate of the prior art.
Figure 9:
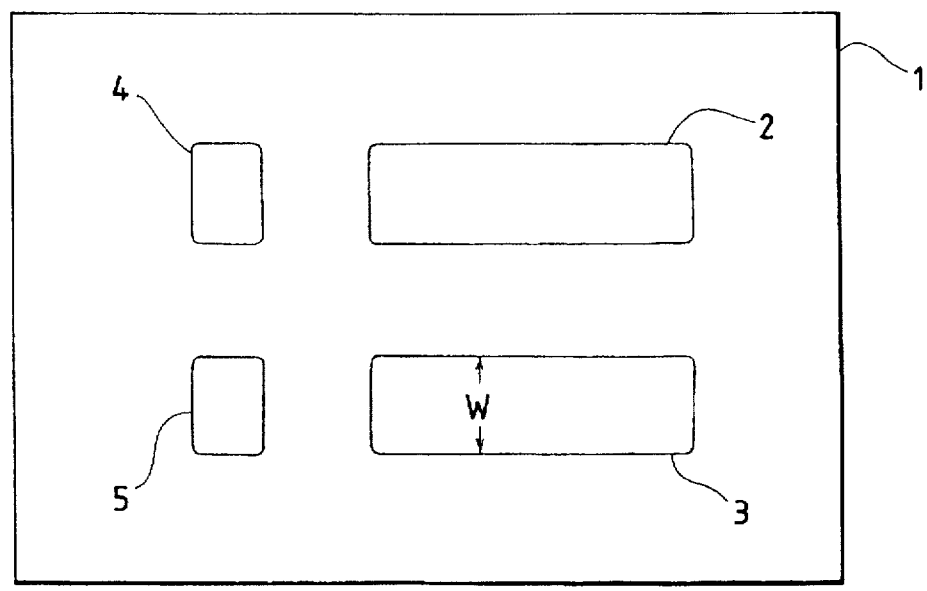
FIG. 9 is a pattern view of the printed substrate of the prior art.

The present invention is to be explained by way of preferred embodiments. FIG. 1 and FIG. 2 show a first embodiment, FIG. 3 shows a second embodiment, FIG. 4 shows a third embodiment, FIG. 5 shows a fourth embodiment, FIG. 6 shows a fifth embodiment and FIG. 7 shows a sixth embodiment of the present invention respectively. Only FIG. 1 shows the state of mounting parts on soldering lands, whereas FIG. 2 to FIG. 7 are views illustrating the configuration of soldering lands respectively.

In the drawings, identical portions for the prior art and the first to sixth embodiments according to the present invention carry the same reference numerals for which duplicate explanations are omitted. The first to sixth embodiments of the present invention are remarkably different from the prior art regarding the configuration of the soldering lands. Namely, the land has a uniform width in the prior art, whereas a common soldering land in which two parts are soldered has a width made larger in an intermediate portion and gradually narrowed as remote from the intermediate portion, and an exclusive land has a width made larger on the side intended for bringing two parts into intimate contact with each other and gradually narrowed toward the opposite side.

Referring at first to the first embodiment with reference to FIG. 1 and FIG. 2 more in details, among soldering lands 11 to 14 according to the present invention illustrated in the drawing, each of common soldering lands 11 and 12 on which two parts 6 and 7 are soldered has a width W1 at an intermediate portion which is gradually increased from a width W2 at both ends.

Each of the exclusive use lands 13 and 14 for the part 6 has a width W3 on the side nearer to the common lands 11 and 12 which is gradually enlarged from a width W4 on the opposite side.

With such a constitution, the two parts 6 and 7 are drawn to each other by the surface tension of the molten solder upon reflow soldering.

Referring then to the second embodiment according to the present invention with reference to FIG. 3, among soldering lands 4, 5, 15 and 16, the shape of the common soldering lands 15 and 16 is different from that of the prior art. That is, the portion of the common lands 15 and 16 on which the part 6 is mounted has a large width W1, which is gradually narrowed into a width W2 from the intermediate portion of the land to the end on which the part 7 is soldered.

With such a constitution, the part 7 is drawn to the part 6 by molten solder upon reflow soldering.

Then, the third embodiment of the present invention is explained referring to FIG. 4. Soldering lands 13 and 14 are identical with those in the first embodiment.

The soldering lands 17, 18 are common soldering lands having a large width W1 at the side on which the part 7 is soldered, having a narrow width w2 at the end on which the part 6 is soldered, contrary to the second embodiment shown in FIG. 3. The exclusive use lands 13 and 14 on which only the part 6 is soldered are the same as those of the first embodiment of FIG. 2.

With such a constitution, the part 6 is drawn to the part 7 by molten solder upon reflow soldering.

FIG. 5 to FIG. 7 show the fourth to sixth embodiments according to the present invention respectively, which correspond to the first to third embodiments shown in FIG. 2 to FIG. 4 respectively. That is, the copper foil surface forming the soldering land has such a shape as having a large width portion and a narrow width portion in the first to third embodiments; whereas the shape of the copper foil surface is made to have a uniform width as in the prior art and soldering resist for inhibiting solder deposition is coated to a portion of the copper foil surface to form a coating film thereby making the shape of the soldering land equal with that of the soldering land in the first to third embodiments, in the fourth to sixth embodiments.

At first, the fourth embodiment according to the present invention is explained with reference to FIG. 5.

In soldering lands 19 to 22, the width of the copper foil surface is identical throughout each of the portions like that the prior art. However, solder resist is coated on portions 27 to 29 shown by vertical lines to form coating films so that solder is not deposited. Accordingly, in the common lands 19 and 20, the width is the largest at the intermediate portion between parts like that in the first embodiment and the width is gradually narrowed as remote from the intermediate portion. The exclusive lands 13 and 14 have a larger width on the side intended for attracting parts and is gradually narrowed toward the opposite side in order to bring the two parts into intimate contact.

Description is to be made for the fifth embodiment according to the present invention with reference to FIG. 6.

Among soldering lands 4, 5, 23 and 24, the lands 4, 5 are identical with those in the prior art. The common lands 23 and 24 have the same shape for the copper foil surface as that of the prior art and have an identical width throughout each of the portions. Resist is coated at a portion 28 illustrated by vertical lines, so that solder is not deposited thereon. Accordingly, in the common lands 23 and 24, the portion on which the part 6 is mounted has a same land width as the prior art and the land width is largest on the side of the part 6, which is gradually narrowed as remote therefrom.

Then, explanation is to be made for the sixth embodiment with reference to FIG. 7. Among soldering lands 21, 22, 25 and 26, the exclusive lands 21 and 22 are identical with the fourth embodiment. The shape of the copper foil surface of the common lands 25 and 26 is identical with the prior art and the width is uniform throughout each of the portions, but resist is coated on a portion 29 illustrated by vertical lines to inhibit solder deposition thereon. Therefore, in the common lands 25 and 26, the portion on which the part 7 is mounted has the same land width as that of the prior art, and the land width on the side of the part 7 is greatest only for the portion on which the part 6 is mounted and the width is gradually narrowed as remote therefrom.

When a cream solder is coated by an appropriate amount to the soldering lands of the printed substrate having the shape as described above and the parts 6 and 7 are mounted and subjected to reflow soldering, the parts are raised by the molten solder and facilitated for movement. Then, the surface tension of the solder pulling from the narrow to large pattern width, and the surface tension of the solder exerting on adjacent parts are further applied, so that the two parts are drawn and brought into intimate contact with each other and soldered.

In the embodiments 1 and 4, since the width of the soldering land is narrowed at both ends, the surface tension of the solder exerts on both of the parts which are drawn to each other.

In the embodiments 2 and 5, since the width of the soldering land is narrowed on the side of the part 7, the surface tension of the solder exerts such that the part 7 is drawn to the part 6.

In the embodiments 3 and 6, since the width of the soldering land is narrowed on the side of the part 6, the surface tension of the solder exerts such that the part 6 is drawn to the part 7.

As has been described above according to the present invention, since the width of the soldering land is changed and the surface tension of the solder is exerted such that the two parts are drawn to each other, the two parts are brought into intimate contact with each other and mounting with intimate bonding can be attained by reflow soldering. This can save the manual operation for drawing parts by a soldering iron conducted in the subsequent step to greatly reduce the number of steps.

Further, there is no requirement for securing a space for the access of a soldering iron at the periphery of a chip part when a chip capacitor or the like is displaced by the soldering iron, making possible high density mounting.

In addition, since the soldering operation using a soldering iron can be saved, even a heat-sensitive part can also be disposed near the chip part to improve the degree of freedom for the pattern layout.

Further, since the operation of displacing chip parts by a soldering iron can be saved, no excess thermal or mechanical stress exerts on chip parts thereby enabling to prevent destruction of parts, occurrence of secondary failure such as solder bridging.

What is claims is:

1. A printed wiring substrate comprising a printed substrate on which a first soldering land and a second soldering land are formed, a first face-mounted part soldered by a reflow method to each of the soldering lands, and a second face-mounted part soldered by the reflow method to the first soldering land, in which the first soldering land has a width larger at an intermediate portion than at both ends, one of the electrodes of the first face-mounted part is soldered to one end while one of the electrodes of the second face-mounted part is soldered to the other end of the first soldering land.

2. A printed wiring substrate as defined in claim 1, wherein the width of at least one soldering land of the first soldering land and the second soldering land is restricted by a solder resist film covering a portion of a copper foil surface of the soldering land.

3. A printed wiring substrate as defined in claim 1, wherein the second soldering land has a width at one end near the first soldering land which is larger than the width at the other end remote from the first soldering land, and the other of the electrodes of the first face-mounted part is soldered to the second soldering land.

4. A printed wiring substrate as defined in claim 3, wherein the width of at least one soldering land of the first soldering land and the second soldering land is restricted by a solder resist film covering a portion of a copper foil surface of the soldering land.

5. A printed wiring substrate comprising a printed substrate on which a first soldering land and a second soldering land are formed, and a face-mounted part soldered to each of the soldering lands by a reflow method, in which the first soldering land has a width made larger at one end remote from the second soldering land than the width at the other end near the second soldering land, the second soldering land has a width made larger at one end near the first soldering land than the width at the other end remote from the first soldering land, one of the electrodes of the face-mounted part is soldered to the first soldering land, and the other of the electrodes of the face-mounted part is soldered to the second soldering land.

6. A printed wiring substrate as defined in claim 5, wherein the width of at least one soldering land of the first soldering land and the second soldering land is restricted by a solder resist film covering a portion of a copper foil surface of the soldering land.

* * * * *